United States Patent
Nishimura et al.

(10) Patent No.: US 6,960,827 B2
(45) Date of Patent: Nov. 1, 2005

(54) SEMICONDUCTOR DEVICE AND MANUFACTURING METHOD THEREOF

(75) Inventors: Takao Nishimura, Kawasaki (JP); Tadashi Uno, Kawasaki (JP); Hiroshi Onodera, Shibata (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 10/817,808

(22) Filed: Apr. 6, 2004

(65) Prior Publication Data

US 2004/0188855 A1 Sep. 30, 2004

Related U.S. Application Data

(62) Division of application No. 10/272,013, filed on Oct. 17, 2002, now Pat. No. 6,781,241.

(30) Foreign Application Priority Data

Apr. 19, 2002 (JP) ........................................ 2002-117534

(51) Int. Cl.[7] .............................................. H01L 23/34
(52) U.S. Cl. ..................... 257/723; 257/686; 257/777; 257/778; 257/779; 257/780; 257/784
(58) Field of Search ................................. 257/686, 685, 257/777–778, 723, 784

(56) References Cited

U.S. PATENT DOCUMENTS 5,091,209 A * 2/1992 Claverie et al. ............ 427/576
5,394,608 A * 3/1995 Tottori et al. ................. 29/840
5,956,233 A * 9/1999 Yew et al. ................... 361/760
6,025,648 A * 2/2000 Takahashi et al. .......... 257/778
6,388,333 B1 5/2002 Taniguchi et al.
6,469,374 B1 * 10/2002 Imoto ......................... 257/686
6,528,348 B2 * 3/2003 Ando et al. ................. 438/109

FOREIGN PATENT DOCUMENTS

JP         2001-223297         8/2001

* cited by examiner

*Primary Examiner*—Luan Thai
(74) *Attorney, Agent, or Firm*—Westerman, Hattori, Daniels & Adrian, LLP

(57) ABSTRACT

A stacked-type semiconductor device has a reduced overall height and an improved reliability in the mechanical strength of the stacked structure. The semiconductor device also has an improved heat release characteristic. A first interposer has a surface on which first electrode pads are formed and a first semiconductor element is mounted with a circuit forming surface facing the first interposer. A second interposer has a surface on which second electrode pads are formed and a second semiconductor element is mounted with a circuit forming surface facing the second interposer. External connection terminals are provided on a surface of the second interposer opposite to the surface on which the second semiconductor element is mounted. The first and second interposers are electrically connected to each other by conductive members provided therebetween. A back surface of the first semiconductor element and a back surface of the second semiconductor element are fixed to each other by an adhesive.

2 Claims, 16 Drawing Sheets

SEMICONDUCTOR DEVICE AND MANUFACTURING METHOD THEREOF

This application is a divisional of application Ser. No. 10/272,013, filed Oct. 17, 2002, now U.S. Pat. No. 6,781,241.

BACKGROUND OF THE INVENTION

1. Field of the Invention

The present invention generally relates to semiconductor devices and, more particularly, to a semiconductor device having a three-dimensional structure in which a plurality of semiconductor devices and semiconductor elements are stacked, and a manufacturing method of such a semiconductor device.

With the development of electric equipments in recent years, a demand for miniaturization in dimensions and thickness, multi-function, high-performance and high-density in the semiconductor devices has been increasing. In order to cope with such a demand, the structure of the semiconductor devices has been shifting to a three-dimensional structure in which a plurality of semiconductor devices or a plurality of semiconductor elements are stacked.

2. Description of the Related Art

Japanese Laid-Open Patent Application No. 2001-223297 discloses an example of a semiconductor device, which has a three-dimensional structure formed by stacking a plurality of semiconductor devices. FIG. 1 is a cross-sectional view of the semiconductor device disclosed in the above-mentioned patent document.

In FIG. 1, semiconductor chips 3 are mounted on both sides of each of interposers 1, and are encapsulated by a seal resin 2, respectively. The two interposers 1 are stacked with the seal resin 2, which encapsulates the semiconductor chip 3, interposed therebetween. The interposers 1 are connected to each other by bonding solder balls 7 to ball pads 5 which are exposed in through holes 6 formed in a solder resist 4. That is, the upper and lower interposers 1 are electrically connected to each other by the solder balls 7, and are also connect mechanically to each other.

In the semiconductor device shown in FIG. 1, since each semiconductor chip mounted on the stacked interposers is encapsulated by the seal resin, it is necessary to provide a distance between two interposers, which distance is greater than the thickness of the seal resin layer interposed between two interposers. Therefore, if the distance between the interposers can be reduced, the overall height of the semiconductor device can also be reduced.

Additionally, since the interposers are connected and fixed to each other by the solder balls provided in the peripheral portion of the interposers, if a warp occurs in the interposers in a stacking process of an assembling process of the semiconductor package, a defect may occur in the connecting part between the interposers. Moreover, when mounting the complete semiconductor package onto a substrate, a defect may occur in the connecting part between the interposers due to a thermal deformation of the interposers and remelting of the solder balls.

Furthermore, since the complete semiconductor package is mechanically connected by a small area with only the solder balls, a stress tends to be concentrated into the connecting part between the interposers, which may deteriorate mechanical reliability of the package.

SUMMARY OF THE INVENTION

It is a general object of the present invention to provide an improved and useful semiconductor device in which the above-mentioned problems are eliminated.

A more specific object of the present invention is to provide a semiconductor device having a three-dimensional structure in which a plurality of semiconductor devices or a plurality of semiconductor elements are stacked, the semiconductor device having a reduced overall height and an improved reliability in the mechanical strength of the stacked structure.

Another object of the present invention is to provide a semiconductor device having a three-dimensional structure in which a plurality of semiconductor devices or a plurality of semiconductor elements are stacked, the semiconductor device having an improved heat release characteristic.

In order to achieve the above-mentioned objects, there is provided according to one aspect of the present invention a semiconductor device comprising: a first semiconductor element having a circuit forming surface and a back surface opposite to the circuit forming surface; a first interposer having a surface on which first electrode pads are formed and the first semiconductor element is mounted with the circuit forming surface facing the first interposer; a second semiconductor element having a circuit forming surface and a back surface opposite to the circuit forming surface; a second interposer having a surface on which second electrode pads are formed and the second semiconductor element is mounted with the circuit forming surface facing the second interposer, the second electrode pads for connection with the first interposer; and external connection terminals provided on a surface of the second interposer opposite to the surface on which the second semiconductor element is mounted, wherein the first interposer and the second interposer are electrically connected to each other by conductive members between the first and second electrode pads, and the back surface of the first semiconductor element and the back surface of the second semiconductor element are fixed to each other by an adhesive.

According to the above-mentioned invention, there is no need to encapsulate the first and second semiconductor elements provided between the first and second interposers. Thus, a distance between the first and second interposers can be reduced, which results in a reduction in an overall thickness of the semiconductor device. Additionally, since the first and second semiconductor elements are bonded to each other by the adhesive, a mechanical strength of the connection between the interposers is improved, which prevents warp of the interposers. Further, since the first and second semiconductor elements are bonded to each other by the adhesive, a heat generated in the first semiconductor element can be efficiently released outside through the second semiconductor element and the second interposer.

The semiconductor device according to the present invention may further comprise at least one third semiconductor element which is mounted on a surface of the first interposer opposite to the surface on which the first semiconductor element is mounted. Accordingly, the number of semiconductor elements stacked in the semiconductor device can be increased, which improves a packaging density. Additionally, a plurality of the third semiconductor elements may be mounted and encapsulated on the surface of the first interposer in a stacked and fixed state. Accordingly, semiconductor elements of different kinds or sizes can be efficiently arranged within the semiconductor device. Further, a metal layer for heat release may be provided on a surface of the first interposer opposite to the surface on which the first semiconductor element is mounted. Accordingly, the metal layer serves as a heat spreader, which can efficiently release a heat of the semiconductor elements to outside of the semiconductor device.

Additionally, there is provided according to another aspect of the present invention a semiconductor device comprising: a first semiconductor element having a circuit forming surface and a back surface opposite to the circuit forming surface; a first interposer having a surface on which first electrode pads are formed and the first semiconductor element is mounted with the circuit forming surface facing the first interposer; a second semiconductor element having a circuit forming surface and a back surface opposite to the circuit forming surface; a second interposer having a surface on which second electrode pads are formed and the second semiconductor element is mounted with the circuit forming surface facing the second interposer, the second electrode pads for connection with the first interposer; and external connection terminals provided on a surface of the second interposer opposite to the surface on which the second semiconductor element is mounted, wherein the first interposer and the second interposer are electrically connected to each other by conductive members between the first and second electrode pads, and the first interposer and the back surface of the second semiconductor element are fixed to each other by an adhesive.

According to the above-mentioned invention, there is no need to encapsulate the second semiconductor element provided between the first and second interposers. Thus, a distance between the first and second interposers can be reduced, which results in a reduction in an overall thickness of the semiconductor device. Additionally, since the second semiconductor element and the first interposer are bonded to each other by the adhesive, a mechanical strength of the connection between the interposers is improved, which prevents warp of the interposers. Further, since the second semiconductor element is bonded to the first interposer by the adhesive, a heat generated in the first semiconductor element can be efficiently released outside through the first interposer, the second semiconductor element and the second interposer.

The semiconductor device according to the present invention may further comprise at least one third semiconductor element mounted on the surface of the first interposer on which the first semiconductor element is mounted. Accordingly, the number of semiconductor elements stacked in the semiconductor device can be increased, which improves a packaging density. Additionally, the semiconductor device may further comprise at least one third semiconductor element is stacked on the first semiconductor element, and the first and third semiconductor elements may be encapsulated on the first interposer.

Additionally, in the semiconductor device according to the present invention, at least one fourth semiconductor element may be mounted on the surface of the second interposer provided with the external connection terminals. A plurality of the fourth semiconductor elements may be provided and encapsulated on the second interposer.

Further, each of the external connection terminals may be a flat pad, or may have a protruding shape. Each of the external connection terminals may be a lead terminal extending in a direction outward from the second interposer.

Additionally, the adhesive, which bonds the back surface of the first semiconductor element and the back surface of the second semiconductor element to each other, may be a thermosetting type resin adhesive. The thermosetting type resin adhesive may contain at least one of silver and copper.

Further, in the semiconductor device according to the present invention, a reinforcing adhesive may be provided to connecting parts between the conductive materials and the first and second interposers. The reinforcing adhesive may be made of an insulating thermosetting type resin material. The reinforcing adhesive may be in the form of a film having openings corresponding to positions of the conductive members.

Additionally, there is provided according to another aspect of the present invention a manufacturing method of a semiconductor device comprising a first semiconductor element and a second semiconductor element, comprising the steps of: mounting the first semiconductor element onto a first interposer in a state in which a circuit forming surface of the first semiconductor element faces the first interposer; mounting the second semiconductor element onto a second interposer in a state in which a circuit forming surface of the second semiconductor element faces the second interposer; electrically connecting the first interposer and the second interposer to each other by stacking the first and second interposers with the second semiconductor element interposed therebetween and heating conductive members provided between the first and second interposers so as to melt the conductive members; and curing a thermosetting adhesive provided between a back surface of the second semiconductor device and one of a back surface of the first semiconductor element and the first interposer by a heat in the step of electrically connecting.

Other objects, features and advantages of the present invention will become more apparent from the following detailed description when read in conjunction with the accompanying drawings.

DETAILED DESCRIPTION OF THE PREFERRED EMBODIMENTS

Figure 2:
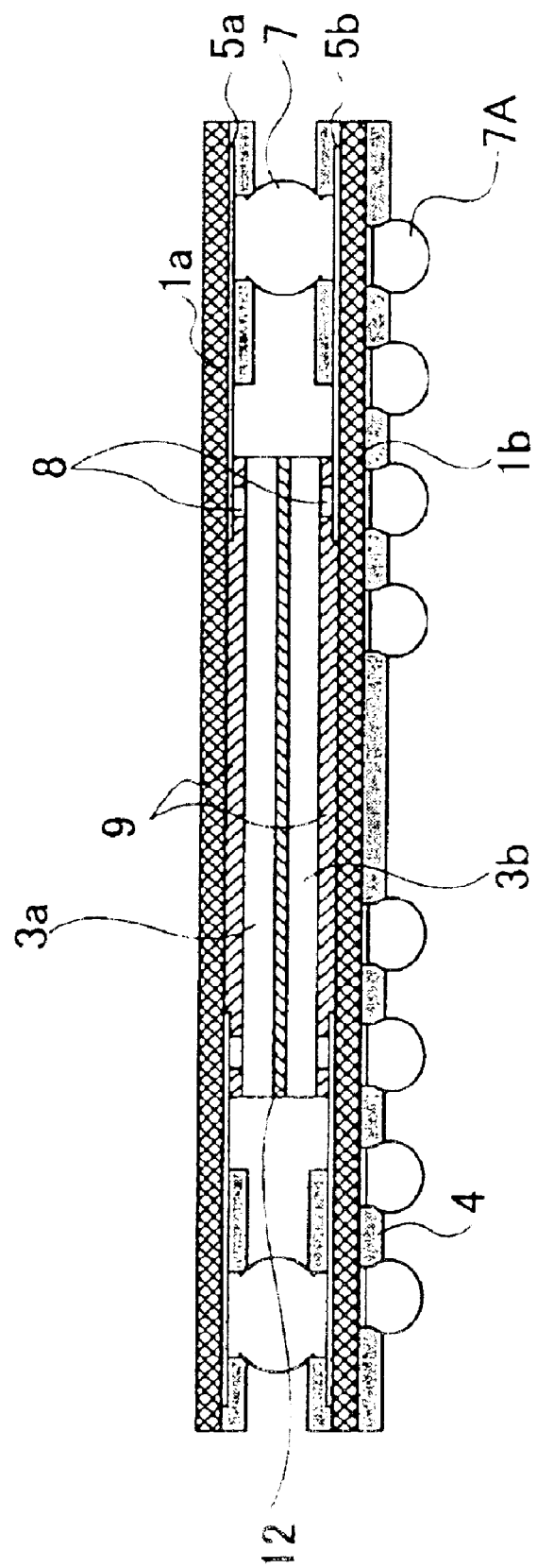
FIG. 2 is a cross-sectional view of a semiconductor device according to a first embodiment of the present invention.

A description will now be given, with reference to FIG. 2, of a semiconductor device according to a first embodiment of the present invention. FIG. 2 is a cross-sectional view of the semiconductor device according to the first embodiment of the present invention.

The semiconductor device shown in FIG. 2 has a configuration where an interposer 1a on which a semiconductor chip 3a is mounted and an interposer 1b on which a semiconductor chip 3b is mounted are stacked. The interposer 1a and the interposer 1b are rearranging substrates, and are formed of a polyimide tape substrate, a glass epoxy substrate, an organic substrate (polycarbonate), etc. The interposer 1a and the interposer 1b are electrically connected to each other by solder balls 7, which are conductive members.

The semiconductor chip 3a is mounted onto the interposer 1a by flip-chip-bonding, which is generally referred to as face-down mounting. That is, the semiconductor chip 3a is electrically connected to electrode pads formed on the undersurface of the interposer 1a through bumps 8 provided on the circuit forming surface of the semiconductor chip 3. The bumps 8 are formed of gold, copper, solder, polymer, etc. The semiconductor chip 3a and the interposer 1a are bonded by an under-fill adhesive 9 provided therebetween so as to be fixed to each other. As for the under-fill adhesive 9, a resin material such as epoxy, acrylics or polyimide is used.

Similarly, the semiconductor chip 3b is mounted on the interposer 1b by face-down mounting (flip-chip-bonding). That is, the semiconductor chip 3b is electrically connected to electrode pads formed on the top surface of the interposer 1b through the bumps 8 provided on the circuit forming surface of the semiconductor chip 3b. The semiconductor chip 3b and the interposer 1b are bonded by the under-fill adhesive 9 provided therebetween, and are fixed to each other.

The interposer 1a and the interposer 1b are stacked with the semiconductor chips 3a and 3b interposed therebetween. Therefore, the back surfaces (a surface opposite to the circuit forming surface) of the semiconductor chips 3a and 3b are in a state where they face each other. In the present embodiment, the back surfaces of the semiconductor chips 3a and 3b which face each other are bonded by an adhesive 12 so that the semiconductor chips 3a and 3b are mechanically fixed to each other. A resin material such as epoxy, acrylics or polyimide is used for the adhesive 12, and, the resin material preferably be a thermosetting type. Additionally, in order to improve thermal conductivity or to improve the electrical property of the semiconductor chips to be bonded, the above-mentioned resin may contain silver or copper.

Solder balls 7A are provided as external connection terminals on the under surface of the lower interposer 1b and parts other than the part in which the solder balls 7A are provided are covered by a solder resist 4.

The solder balls 7, which electrically connect interposer 1a and the interposer 1b, are joined to both ball pads 5a formed on the undersurface of the interposer 1a and ball pads 5b formed on the top surface of the interposer 1b. Therefore, the height of the solder balls 7 is almost equal to a height of a sum of the heights of the semiconductor chip 3a and the semiconductor chip 3b. The ball pads 5a and the ball pad 5b are formed as parts exposed in openings formed in the solder resist 4.

Here, since the circuit forming surface of the semiconductor chip 3a faces the interposer 1a and the under-fill adhesive 9 is filled therebetween, there is no need to encapsulate the semiconductor chip 3a by a seal resin. Similarly, since the circuit forming surface of the semiconductor chip 3b faces the interposer 1b and the under-fill adhesive 9 is filled therebetween, there is no need to encapsulate the semiconductor chip 3b by a seal resin.

Figure 1:
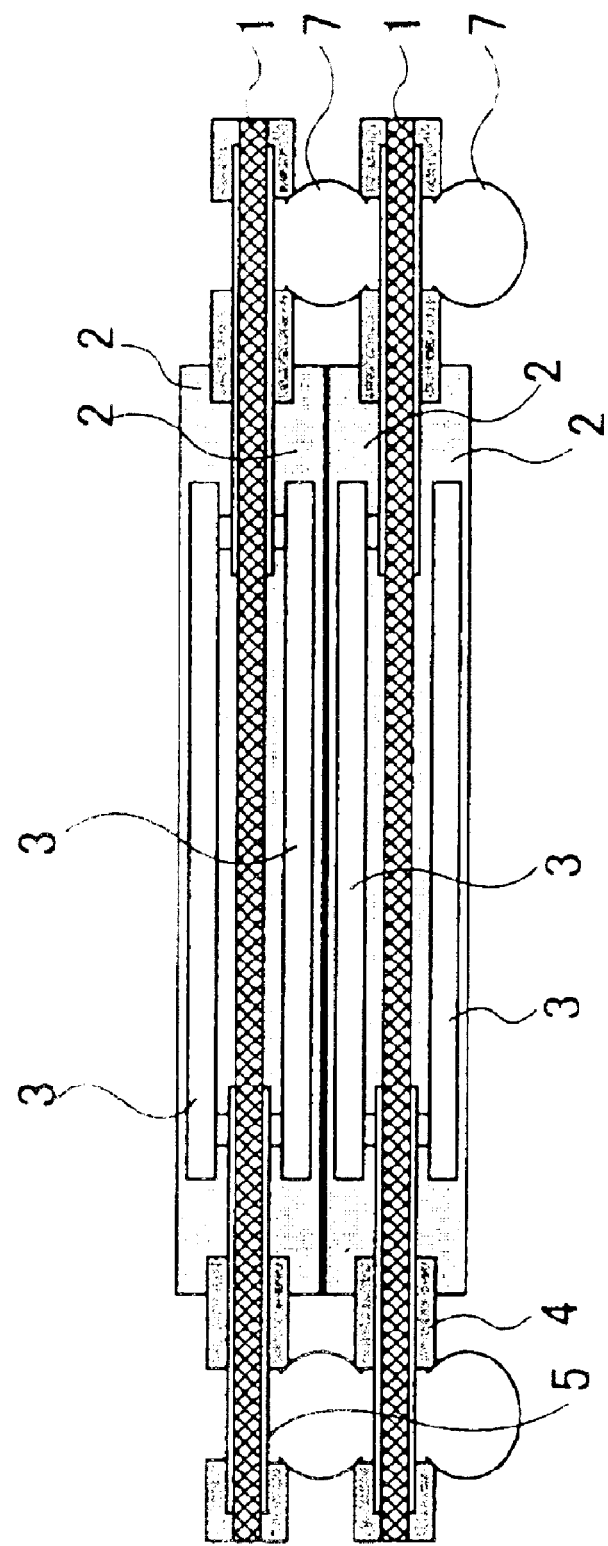
FIG. 1 is a cross-sectional view of a conventional semiconductor device.

Therefore, there is no need to maintain a height (distance) which is required for the seal resin part between the interposer 1a and the interposer 1b, and only a distance corresponding to a sum of the heights of the semiconductor chips 3a and 3b and the thickness of the adhesive 12. Thereby, the thickness of the semiconductor device according to the present embodiment can be smaller than the thickness of the conventional semiconductor device shown in FIG. 1.

Additionally, the interposer 1a and the interposer 1b are mechanically and firmly bonded by bonding the semiconductor chip 3a and the semiconductor chip 3b with the adhesive 12 in addition to the connection by the solder balls 7. Therefore, a thermal stress and an external force are prevented from concentrating into the connection parts of the solder balls 7, thereby improving the reliability of the mechanical connection between the interposers.

Furthermore, by making the adhesive bond 12 as a fast cure type thermosetting resin, the adhesive 12 can be cured by heating during a reflow process to join the solder balls 7 to the interposers 1a and 1b. Since the adhesive 12 is cured before the solder balls 7 melt and solidify again, the interposer 1a and the interposer 1b are fixed to each other when the solder balls 7 are cured, and, thus, the connecting positions of the solder balls cannot shift. Therefore, an accurate positioning can be achieved, and generation of a residual stress in the solder balls in the reflow process can be prevented.

Moreover, in the present embodiment, since the semiconductor chip 3a is bonded to the semiconductor chip 3b by the thin layer of an adhesive 12, the heat generated within the semiconductor chip 3a is transmitted also to the lower interposer 1b through the adhesive bond 12 and the semiconductor chip 3b. The heat of the interposer 1b is efficiently emitted outside through the solder balls 7A. Therefore, according to the present embodiment, since a number of paths to transmit a heat from the semiconductor chip mounted on the upper interposer 1a to the lower interposer 1b is increased the heat from the semiconductor chip can be efficiently released outside through the interposer 1b.

It should be noted that although the semiconductor chips 3a and 3b are mounted on the respective interposers 1a and 1b by flip-chip bonding, they may use TAB (tape automated bonding technique) as a method of carrying out face-down mounting. Moreover, although the interposers 1a and 1b are electrically connected by the solder balls 7, the bonding material and method are not limited to that disclosed. For example, instead of the solder balls 7, the connection can be made by copper post electrodes or resin balls having surfaces covered by a conductive material such as Ni/Au and the like.

Figure 3:
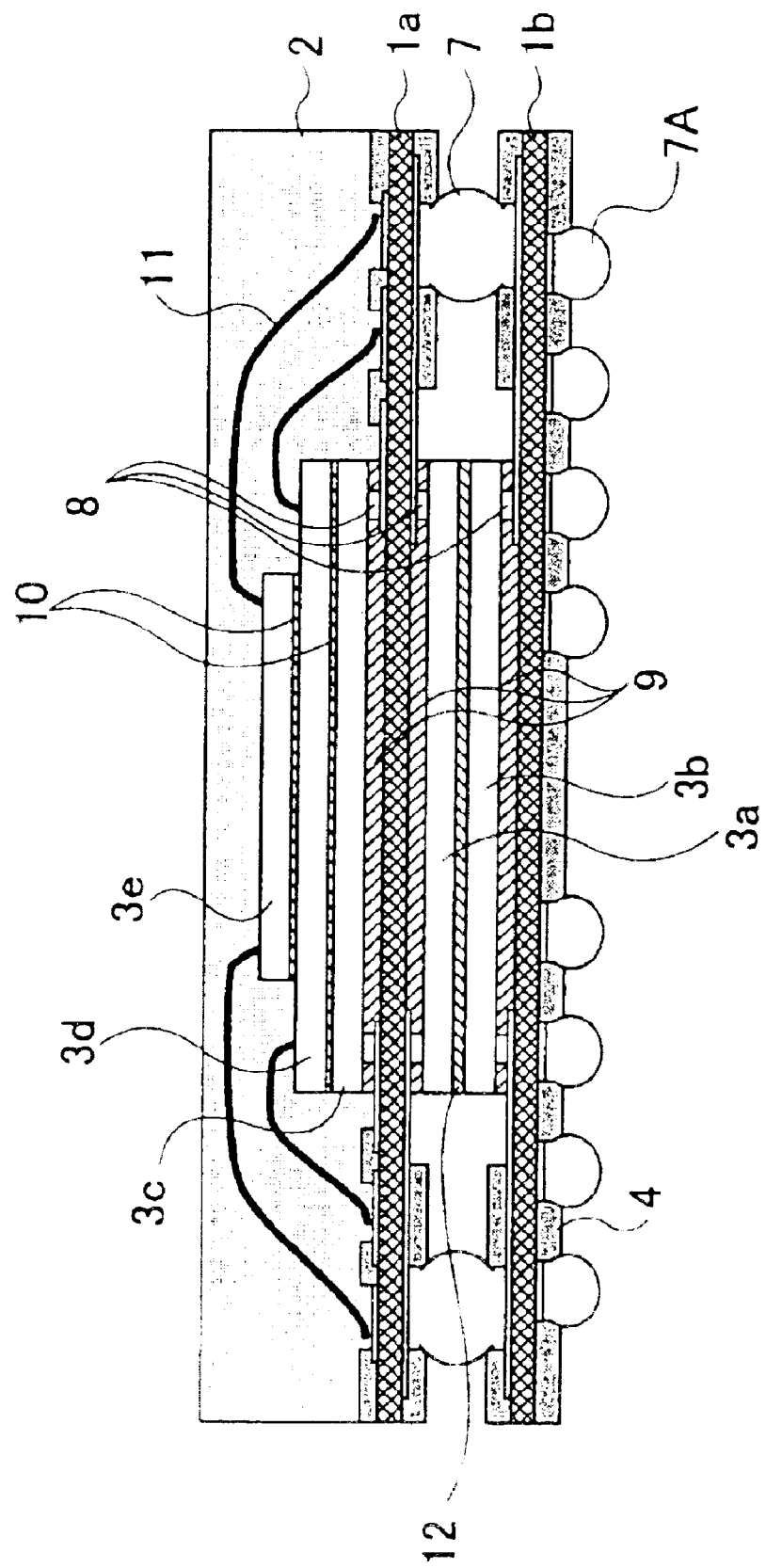
FIG. 3 is a cross-sectional view of a semiconductor device according to a second embodiment of the present invention.

Next, a description will be given, with reference to FIG. 3, of a semiconductor device according to a second embodiment of the present invention. FIG. 3 is a cross-sectional view of the semiconductor device according to the second embodiment of the present invention. In FIG. 3, parts that are the same as the parts shown in FIG. 2 are given the same reference numerals, and descriptions thereof will be omitted.

The semiconductor device according to the second embodiment of the present invention is configured by mounting a plurality of semiconductor chips 3c, 3d and 3e onto the top surface of the interposer shown in FIG. 2 in a stacked state.

The semiconductor chip 3c is electrically connected to the top surface of the interposer 1a through bumps 8. The semiconductor chip 3c and the interposer 1a are bonded by the under-fill adhesive 9.

The semiconductor chip 3d is mounted on the back surface of the semiconductor chip 3c in a stacked state, and is bonded to the semiconductor chip 3c by a die-bonding adhesive 10. As for the die-bonding adhesive 10, a resin material such as epoxy, acrylics or polyimide can be used. The semiconductor chip 3d is mounted on the semiconductor chip 3c with the circuit forming surface up, and is electrically connected to the electrode pads formed on the top surface of the interposer 1a by Au wires.

The semiconductor chip 3e is smaller than the semiconductor chip 3d, and is arranged in a stacked state in the center portion of the circuit forming surface of the semiconductor chip 3d where no electrode pad is formed. The semiconductor chip 3e is stacked on the semiconductor chip 3d with the circuit forming surface up, and is electrically connected to the electrode pads formed on the top surface of the interposer 1a by Au wires.

In the above-mentioned structure, the semiconductor chips 3c, 3d and 3e are encapsulated by the seal resin 2 on the top surface of the interposer 1a. As for the seal resin 2, materials such as epoxy, acrylics or polyimide can be used.

The semiconductor device according to the present embodiment can provide the same effects as the semiconductor device according to the above-mentioned first embodiment. Additionally, a heat from the semiconductor chips 3c, 3d and 3e, which are stacked on the top surface of the interposer 1a, is also transmitted to the lower interposer 1b through the semiconductor chip 3a and the semiconductor chip 3b bonded to the semiconductor chip 3a. Thereby, the heat from the semiconductor chips 3c, 3d and 3e, which are stacked on the top surface of the interposer 1a, can also be efficiently emitted outside through the lower interposer 1b.

It should be noted that, although three semiconductor chips are stacked on the interposer 1a and encapsulated by a seal resin, the present invention is not limited to the number of semiconductor chips and the method of mounting, and a different number of semiconductor chips may be mounted by a different mounting method.

Figure 4:
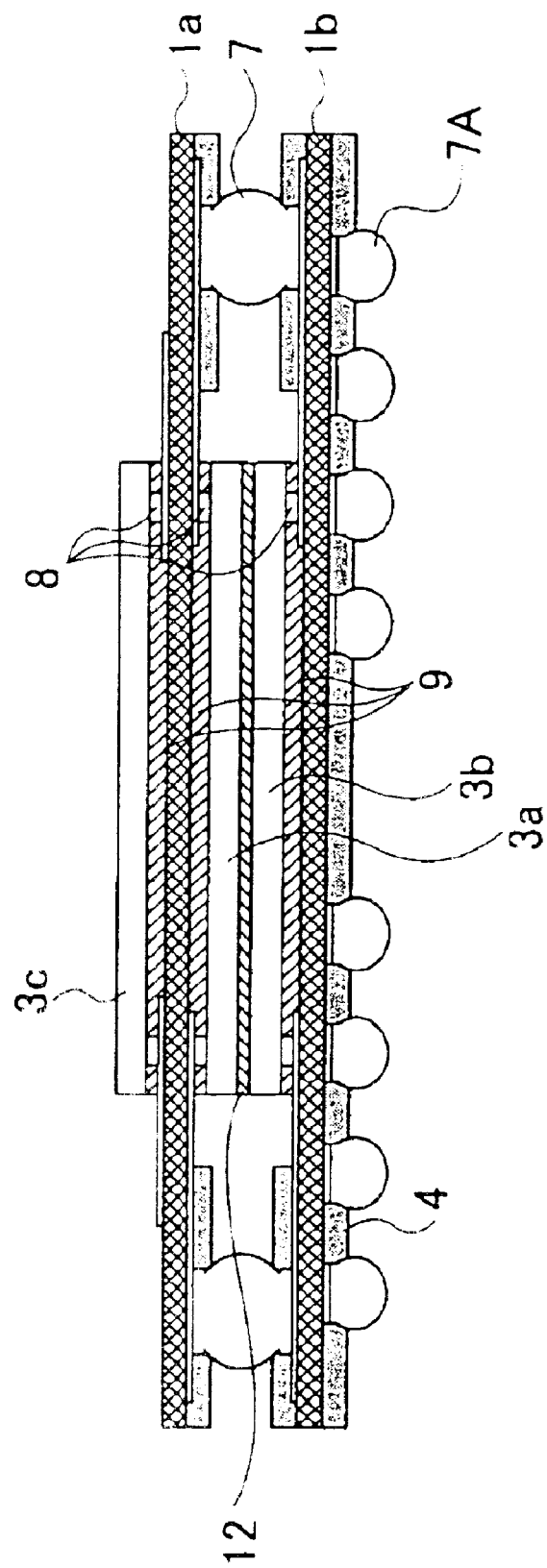
FIG. 4 is a cross-sectional view of a semiconductor device according to a third embodiment of the present invention.

Next, a description will be given, with reference to FIG. 4, of a semiconductor device according to a third embodiment of the present invention. FIG. 4, is a cross-sectional view of the semiconductor device according to the third embodiment of the present invention. In FIG. 4, parts that are the same as the parts shown in FIG. 2 are given the same reference numerals, and descriptions thereof will be omitted.

The semiconductor device according to the third embodiment of the present invention has a structure in which the semiconductor chip 3c is mounted on the top surface of the interposer 1a of the semiconductor device shown in FIG. 2. The semiconductor chip 3c is electrically connected to the top surface of the interposer 1a through bumps 8. The semiconductor chip 3c and the interposer 1a are bonded by the under-fill adhesive 9.

Since the semiconductor chip 3c stacked on the interposer 1a is mounted with the circuit forming surface down and the under-fill adhesive 9 is filled between the circuit forming surface and the interposer 1a, there is no need to encapsulate the semiconductor chip 3c by a seal resin.

As mentioned above, the semiconductor chip 3b is electrically connected to the top surface of the interposer 1b through the bumps 8. Moreover, the interposers 1a and 1b are electrically connected by the solder balls 7, and the solder balls 7A as external connection terminals are provided on the undersurface of the interposer 1b. Therefore, the semiconductor chips 3b and 3c are electrically connected to the interposer 1b through the solder balls 7, and are electrically connectable to an external circuit through the solder balls 7A serving as external connection terminals.

The semiconductor device according to the present embodiment can provide the same effect as the semiconductor device according to the above-mentioned first embodiment. Moreover, a heat from the semiconductor chip 3c, which is stacked on the interposer 1a, can be transmitted to the lower interposer 1b through the semiconductor chip 3a mounted on the undersurface of the interposer 1a and the semiconductor chip 3b bonded to the semiconductor chip 3a. Thereby, the heat from the semiconductor chip 3c, which is mounted on the top surface of the interposer 1a, can be efficiently released outside through the interposer 1b.

Figure 5:
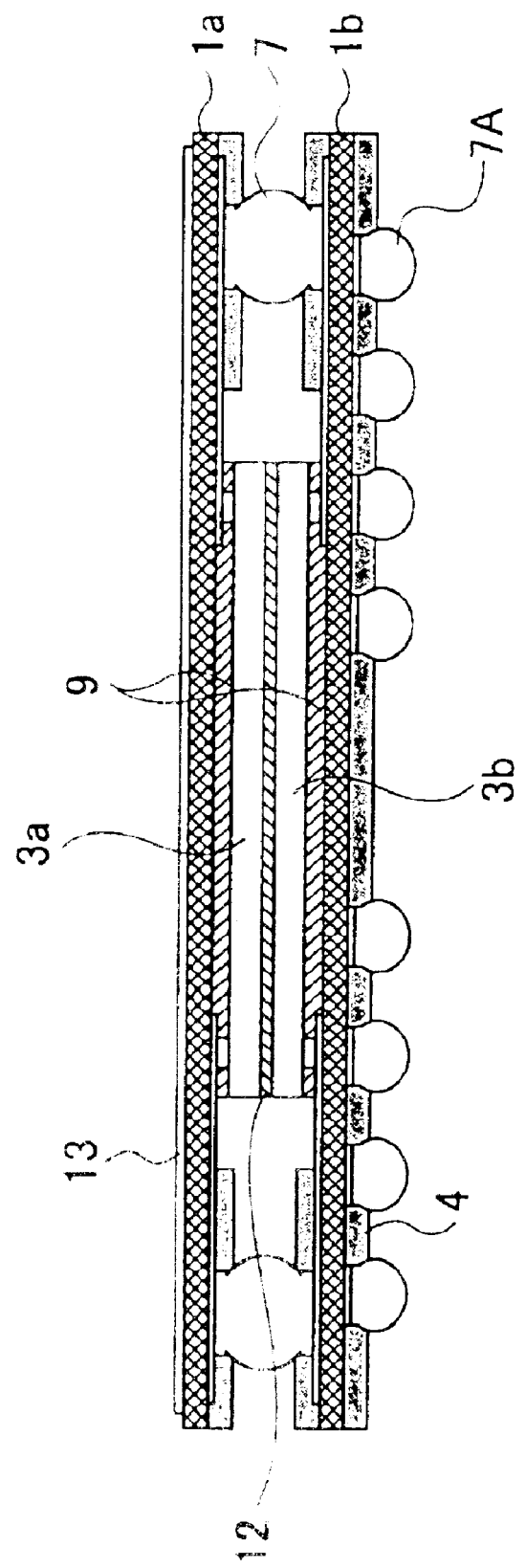
FIG. 5 is a cross-sectional view of a semiconductor device according to a fourth embodiment of the present invention.

Next, a description will be given, with reference to FIG. 5, of a semiconductor device according to a fourth embodiment of the present invention. FIG. 5 is a cross-sectional view of the semiconductor device according to the fourth embodiment of the present invention. In FIG. 5, parts that are the same as the parts shown in FIG. 2 are given the same reference numerals, and descriptions thereof will be omitted.

The semiconductor device according to the fourth embodiment of the present invention has a structure in which a heat spreader 13 is provided on the top surface of the interposer 1a of the semiconductor device shown in FIG. 2. The heat spreader 13 for heat dissipation is formed as a metal layer formed of a material containing Cu, CuW, W, Al, AlC, Ag, etc., and is a member in the form of a sheet or a foil so as to be applied onto the top surface of the interposer 1a. When producing the heat spreader 13, the heat spreader 13 may be formed on the top surface of the interposer by using a wiring material such as a copper foil.

In the present embodiment, the heat from the semiconductor chip 3a is transmitted to the semiconductor chip 3b and also to the heat spreader 13 through the interposer 1a, and, therefore, the heat from the semiconductor chip 3a can be efficiently released outside through the heat spreader 13. Additionally, when an amount of heat generated in the semiconductor chip 3b is large, the heat from the semiconductor chip 3b is transmitted to the semiconductor chip 3a and the interposer 1a, and, thus, the heat is efficiently emitted outside through the heat spreader 13.

It should be noted that the configuration, the method of forming and the method of arranging of the heat spreader are not limited to the specific configuration and methods, and appropriate configuration and methods may be used if necessary.

Figure 6:
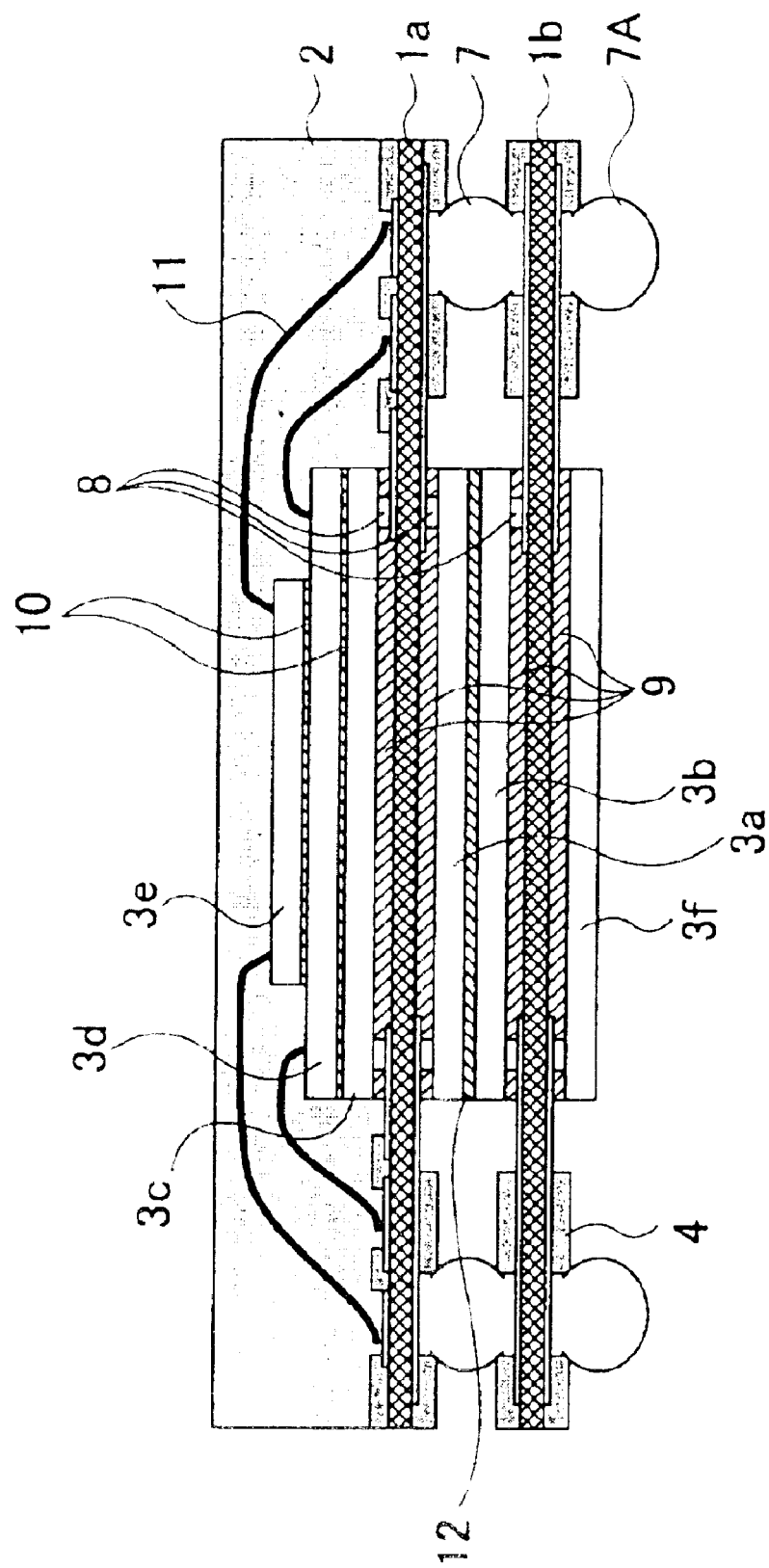
FIG. 6 is a cross-sectional view of a semiconductor device according to a fifth embodiment of the present invention.

Next, a description will be given, with reference to FIG. 6, of a semiconductor device according to a fifth embodiment of the present invention. FIG. 6 is a cross-sectional view of the semiconductor device according to the fifth. embodiment of the present invention. In FIG. 6, parts that are the same as the parts shown in FIG. 3 are given the same reference numerals, and descriptions thereof will be omitted.

The semiconductor device according to the fifth embodiment of the present invention has a basic structure the same as that of the semiconductor device according to the second embodiment shown in FIG. 3, and is further provided with a semiconductor chip 3f. The semiconductor chip 3f is electrically connected to the undersurface of the interposer 1b through the bumps 8. The semiconductor chip 3f and the interposer 1b are bonded by the under-fill adhesive 9.

In the present embodiment, the solder ball 7A as external connection terminals are arranged in the circumference part of the interposer 1b, and the semiconductor chip 3f is mounted in the center portion of the under surface of the interposer 1b by flip-chip bonding. Therefore, solder balls 7A are formed so that they have a height larger than the height of the semiconductor chip 3f. According to the present embodiment, the number of stacked semiconductor chips can be increased, and, thus, the package density of semiconductor chips can be improved.

Figure 7:
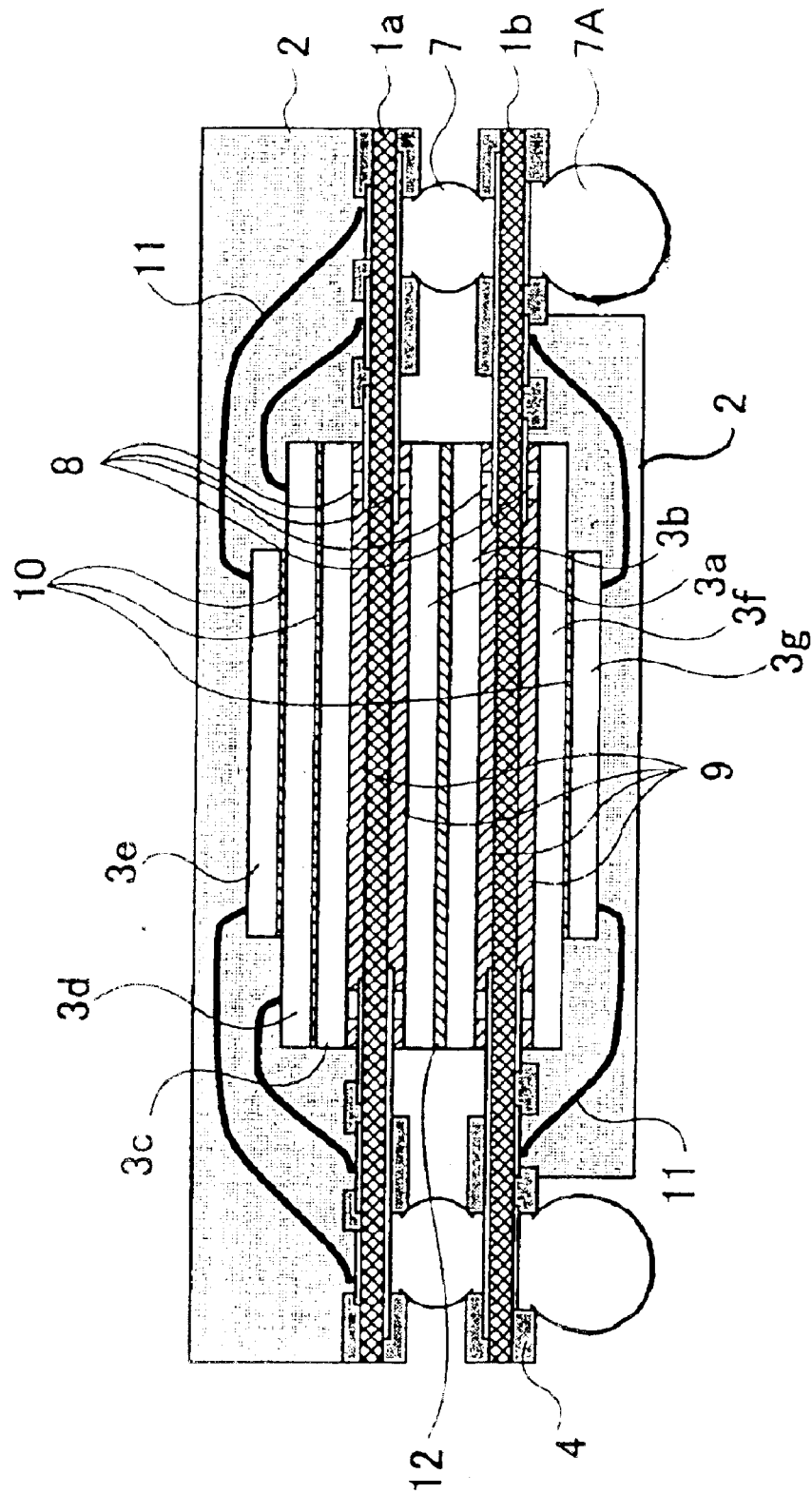
FIG. 7 is a cross-sectional view of a semiconductor device according to a sixth embodiment of the present invention.

Next, a description will be given, with reference to FIG. 7, of a semiconductor device according to a sixth embodiment of the present invention. FIG. 7 is a cross-sectional view of the semiconductor device according to the sixth embodiment of the present invention. In FIG. 7, parts that are the same as the parts shown in FIG. 6 are given the same reference numerals, and descriptions thereof will be omitted.

The semiconductor device according to the sixth embodiment of the present invention has the same basic structure as the semiconductor device according to the fifth embodiment shown in FIG. 6, and is further provided with a semiconductor chip 3g. The semiconductor chip 3g is electrically connected to the undersurface of the interposer 1b through the Au wires 11. The semiconductor chip 3g is bonded to the back surface of the semiconductor chip 3f by the die bonding adhesive 10. Additionally, since the semiconductor chip 3g is connected by Au wires, the semiconductor chips 3f and 3g are integrally encapsulated by the seal resin 2 on the undersurface of the interposer 1b.

In the present embodiment, the solder balls 7A as external connection terminals are arranged in the circumference part of the interposer 1b, and the semiconductor chips 3f and 3g are stacked and mounted on the center portion of the undersurface of the interposer 1b by flip-chip bonding. Therefore, the solder balls 7A are formed so that they have a height larger than the height of the seal resin 2. According to the present embodiment, the number of stacked semiconductor chips can be increased, and a packaging density of semiconductor chips can be improved.

Figure 8:
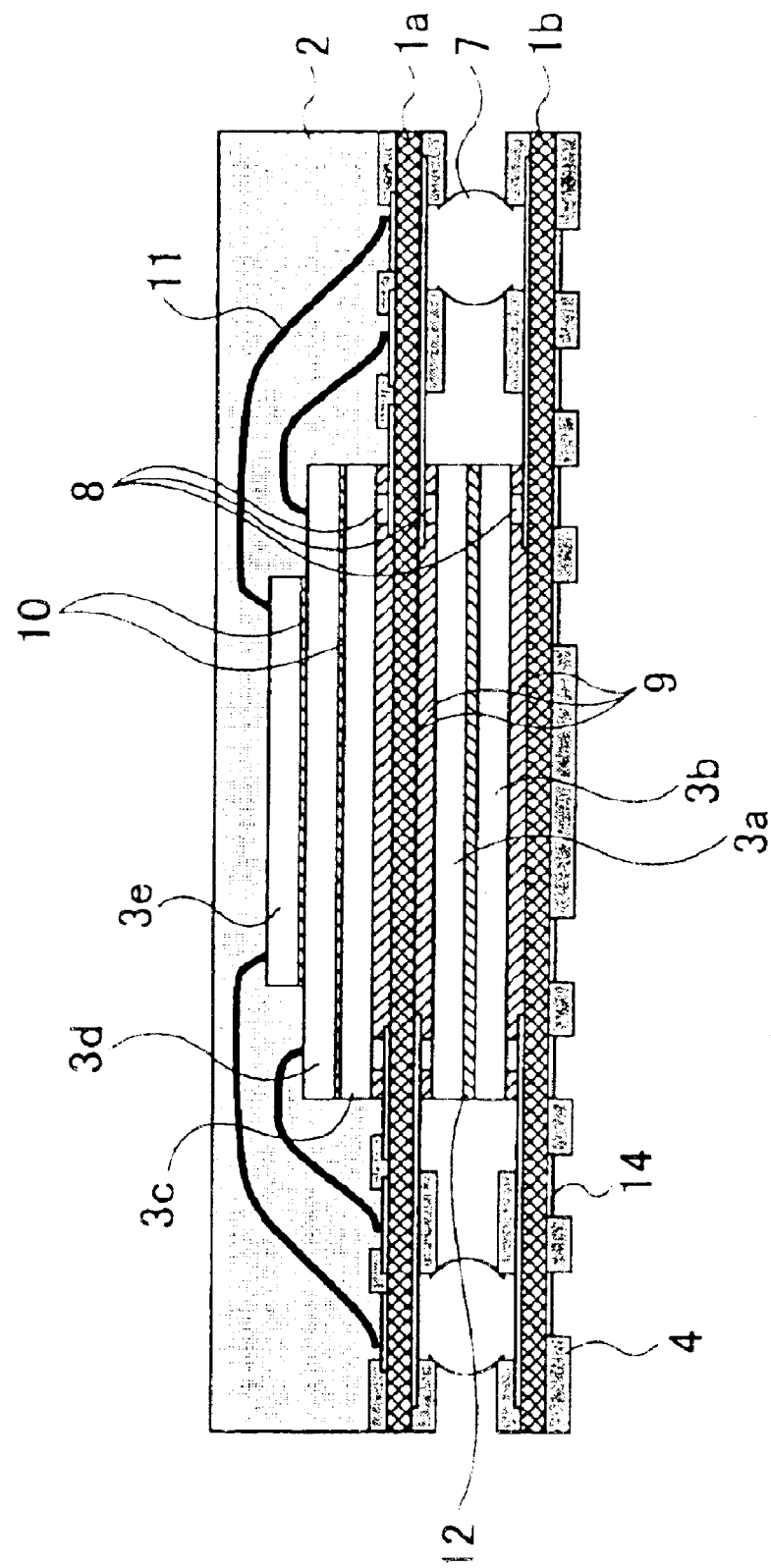
FIG. 8 is a cross-sectional view of a semiconductor device according to a seventh embodiment of the present invention.

Next, a description will be given, with reference to FIG. 8, of a semiconductor device according to a seventh embodiment of the present invention. FIG. 8 is a cross-sectional view of the semiconductor device according to the seventh embodiment of the present invention. In FIG. 8, parts that are the same as the parts shown in FIG. 3 are given the same reference numerals, and descriptions thereof will be omitted.

The semiconductor device according to the seventh embodiment of the present invention has a basic structure the same as the semiconductor device according to the second embodiment shown in FIG. 3, and is made as a land-grid-array (LGA) type semiconductor device. That is, although the semiconductor device according to the second embodiment shown in FIG. 3 is a ball-grid-array (BGA) type semiconductor device in which the solder balls 7A are provided on the undersurface of the interposer, the solder balls are not provided in the present embodiment and electrode pads 14 are exposed on the undersurface of the interposer 1b so that the electrode pads serve as external connection terminals.

Figure 9:
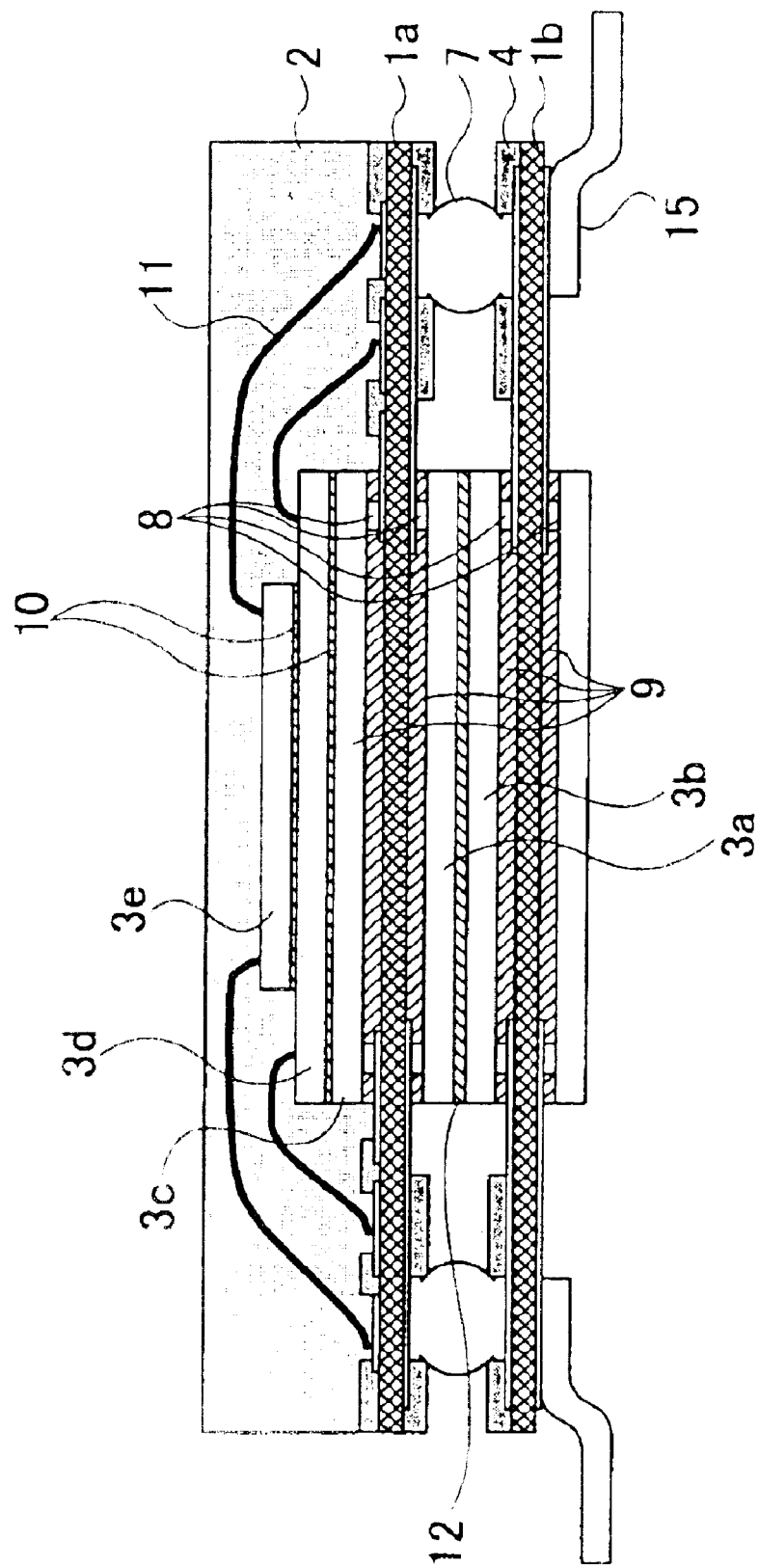
FIG. 9 is a cross-sectional view of a semiconductor device according to an eight embodiment of the present invention.

Next, a description will be given, with reference to FIG. 9, of a semiconductor device according to an eighth embodiment of the present invention. FIG. 9 is a cross-sectional view of the semiconductor device according to the eighth embodiment of the present invention. In FIG. 9, parts that are the same as the parts shown in FIG. 6 are given the same reference numerals, and descriptions thereof will be omitted.

The semiconductor device according to the eighth embodiment of the present invention has a basic structure the same as the semiconductor device according to the fifth embodiment shown in FIG. 6, and is configured as a lead-terminal type semiconductor device. Namely, although the semiconductor device according to the fifth embodiment shown in FIG. 6 is a semiconductor device of the BGA (ball grid array) type in which the solder balls 7A are provided on the undersurface of the interposer so as to serve as external connection terminals, the semiconductor device according to the present embodiment is not provided with the solder balls 7A, and, instead, leads 15 are provided on the undersurface of the interposer 1b so as to serve as external connection terminals.

Figure 10:
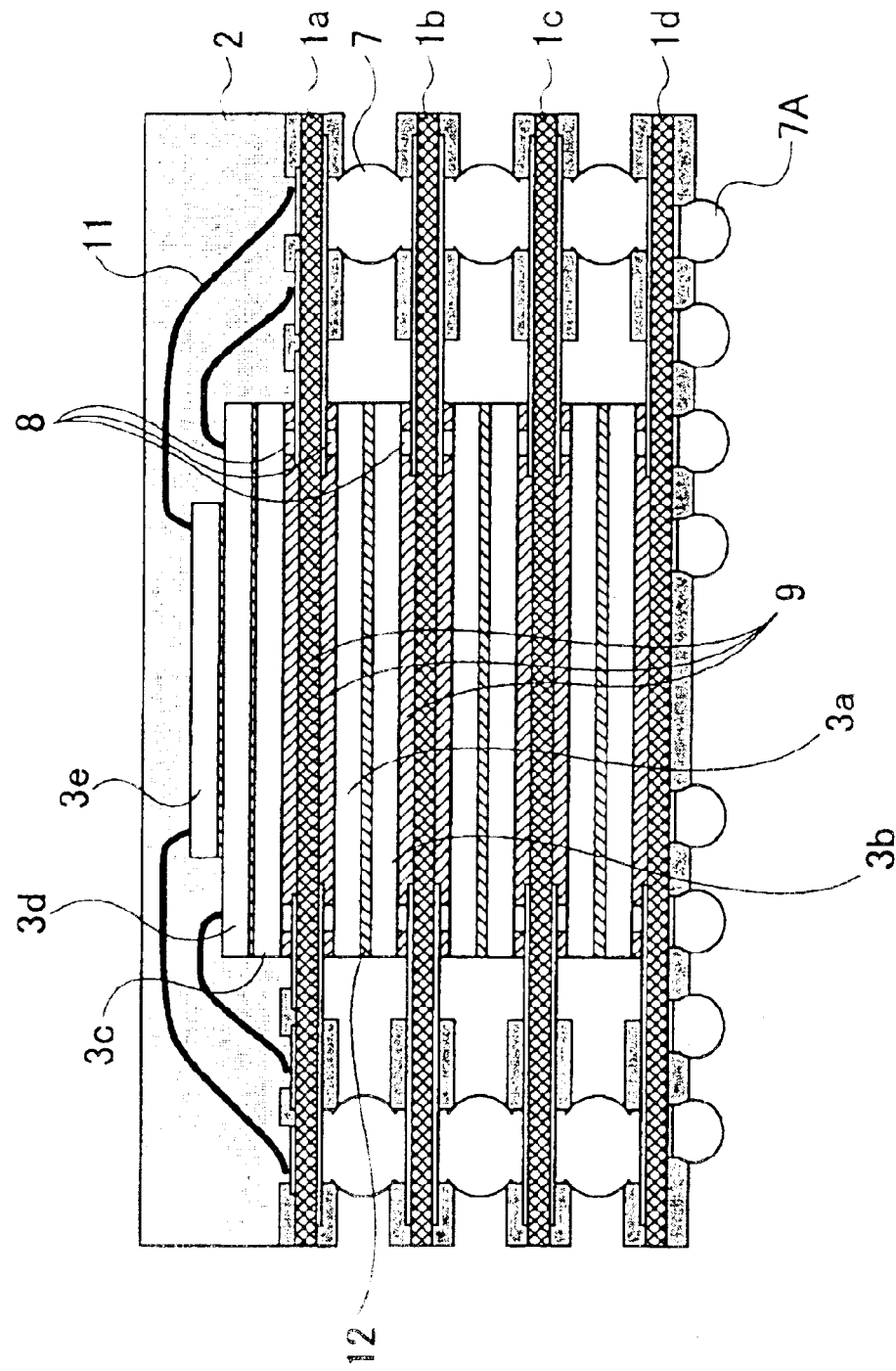
FIG. 10 is a cross-sectional view of a semiconductor device according to a ninth embodiment of the present invention.

Next, a description will be given, with reference to FIG. 10, of a semiconductor device according to a ninth embodiment of the present invention. FIG. 10 is a cross-sectional view of the semiconductor device according to the ninth embodiment of the present invention. In FIG. 10, parts that are the same as the parts shown in FIG. 3 are given the same reference numerals, and descriptions thereof will be omitted.

The semiconductor device according to the ninth embodiment of the present invention has a basic structure the same as the semiconductor device according to the second embodiment shown in FIG. 3, and is further provided with interposers 1c and 1d. Semiconductor chips and solder balls are provided between the interposers 1b and 1c and between the interposers 1c and 1d in the same arrangement as the structure having the-semiconductor chips 3a and 3b provided between the interposers 1a and 1b. The solder balls 7A serving as external connection terminals are provided on the undersurface of the lowermost interposer 1d.

According to the present embodiment, the number of the stacked semiconductor chips can be increased, and the packaging density of the semiconductor chips can be improved. The number of interposers and the number of semiconductor chips to be stacked are not limited to the illustrated number, and the number of semiconductor chips can be increased by increasing the number of interposers to be stacked.

Figure 11:
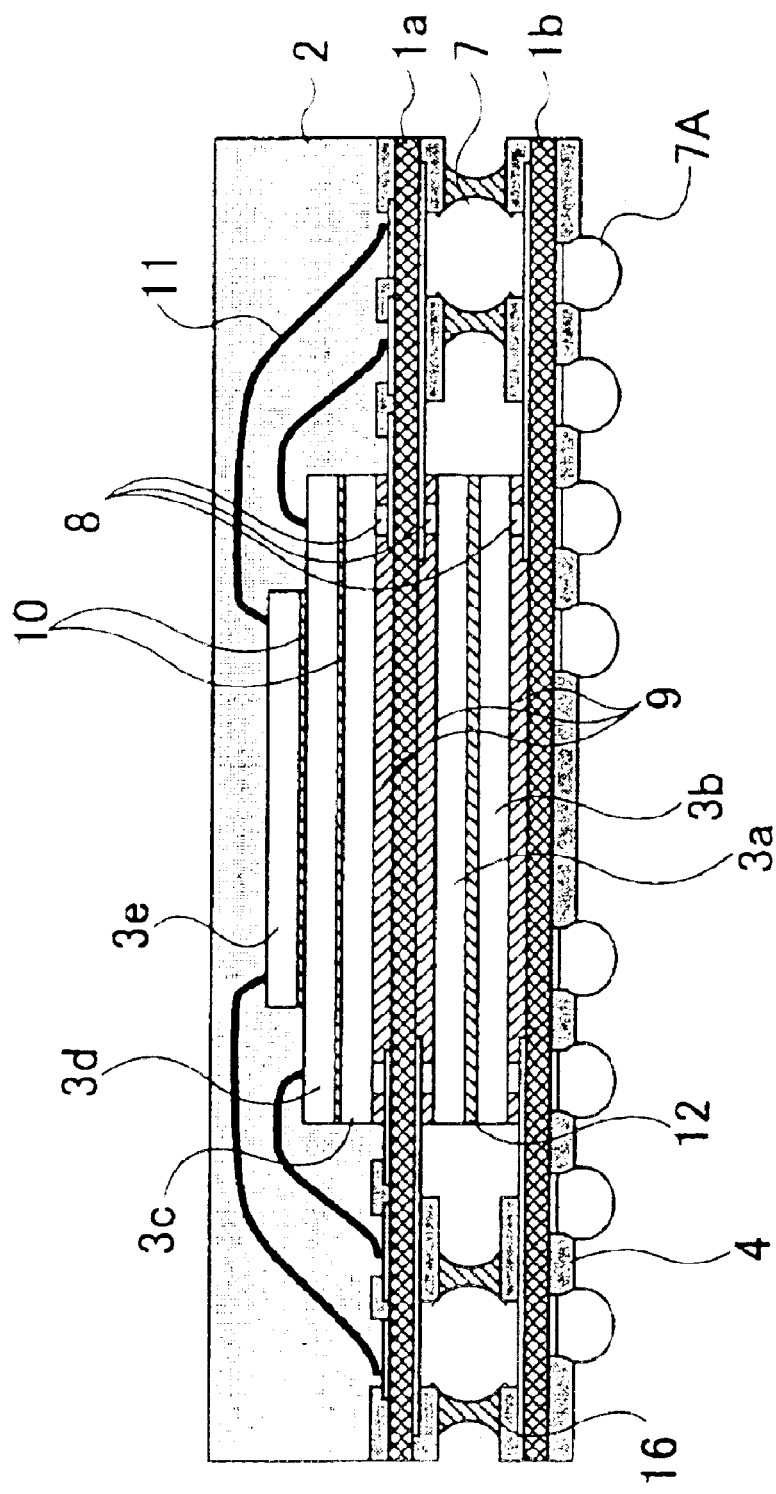
FIG. 11 is a cross-sectional view of a semiconductor device according to a tenth embodiment of the present invention.

Next, a description will be given, with reference to FIG. 11, of a semiconductor device according to a tenth embodiment of the present invention. FIG. 11 is a cross-sectional view of the semiconductor device according to the tenth embodiment of the present invention. In FIG. 11, parts that are the same as the parts shown in FIG. 3 are given the same reference numerals, and descriptions thereof will be omitted.

The semiconductor device according to the tenth embodiment of the present invention has a basic structure the same as the semiconductor device according to the second embodiment shown in FIG. 3, and the connection parts of the solder balls 7 are reinforced by an adhesive 16. That is, after connecting the interposers 1a and 1b mutually with the solder balls 7, the adhesive 16 is applied around the solder balls 7 and is cured. As the adhesive 16, an insulating resin material such as epoxy, acrylics or polyimide is used, and it is preferable to use a thermosetting type resin.

According to the present embodiment, since the connection parts of the solder balls 7 are reinforced by the adhesive 16, the reliability of the connection parts is improved. Additionally, since the solder balls 7 are covered and protected by the adhesive 16, an electric short-circuit is prevented from occurring between the adjacent solder balls 7 even if, for example, a conductive foreign matter or the like enters between the interposers.

Figure 12:
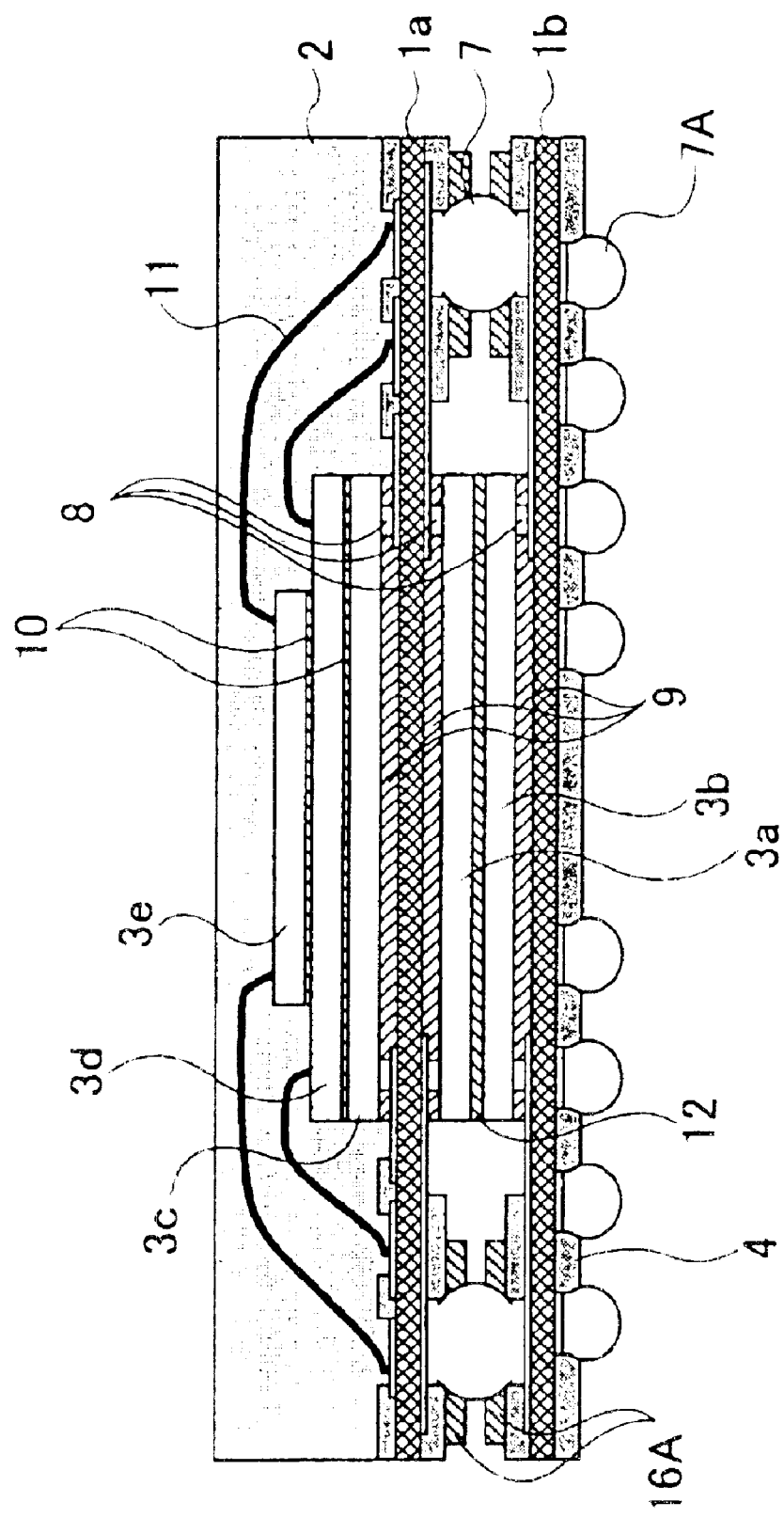
FIG. 12 is a cross-sectional view of a semiconductor device, which is a variation of the semiconductor device shown in FIG. 11.

FIG. 12 is a cross-sectional view of a semiconductor device, which is a variation of the semiconductor device shown in FIG. 11. In the semiconductor device shown in FIG. 12, an adhesive 16A in the form of a sheet or a film is applied on the connection parts of the solder balls 7 instead of applying the adhesive 16, which is a liquid type, and the adhesive 16A is cured by heat.

Figure 13A:
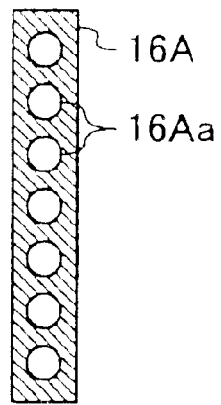
FIGS. 13A and 13B are illustrations of configurations of an adhesive shown in FIG. 11.
Figure 13B:
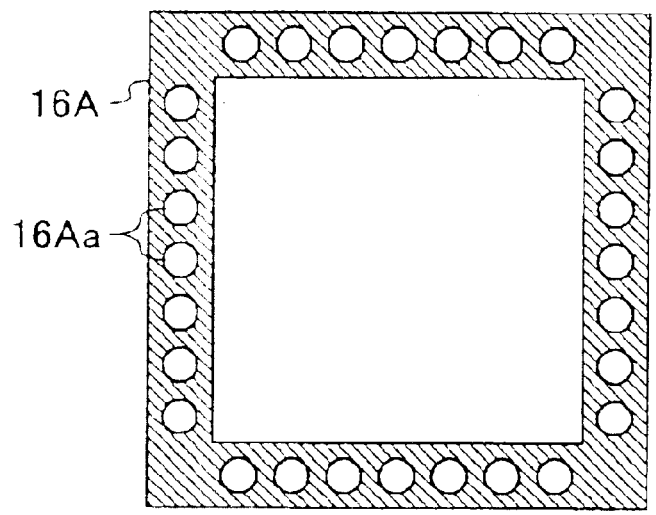

FIGS. 13A and 13B are illustrations showing examples of the configuration of the adhesive 16A in the form of a sheet or a film. The adhesive 16A may be formed by a adhesive film having a stripe shape corresponding to the row of the solder balls 7, as shown in FIG. 13A, and openings 6Aa are formed beforehand in positions corresponding to the solder balls by punching using a die. When the solder balls 7 are circumferentially arranged, the adhesive film 16A may be formed in the shape of a frame, as shown in FIG. 13B, and the openings 16Aa are formed in positions corresponding to the solder balls 7. The adhesive 16A may be placed before the solder balls 7 are subjected to reflow so that the adhesive 16A is melted and cured by the heat of the reflow.

Figure 14:
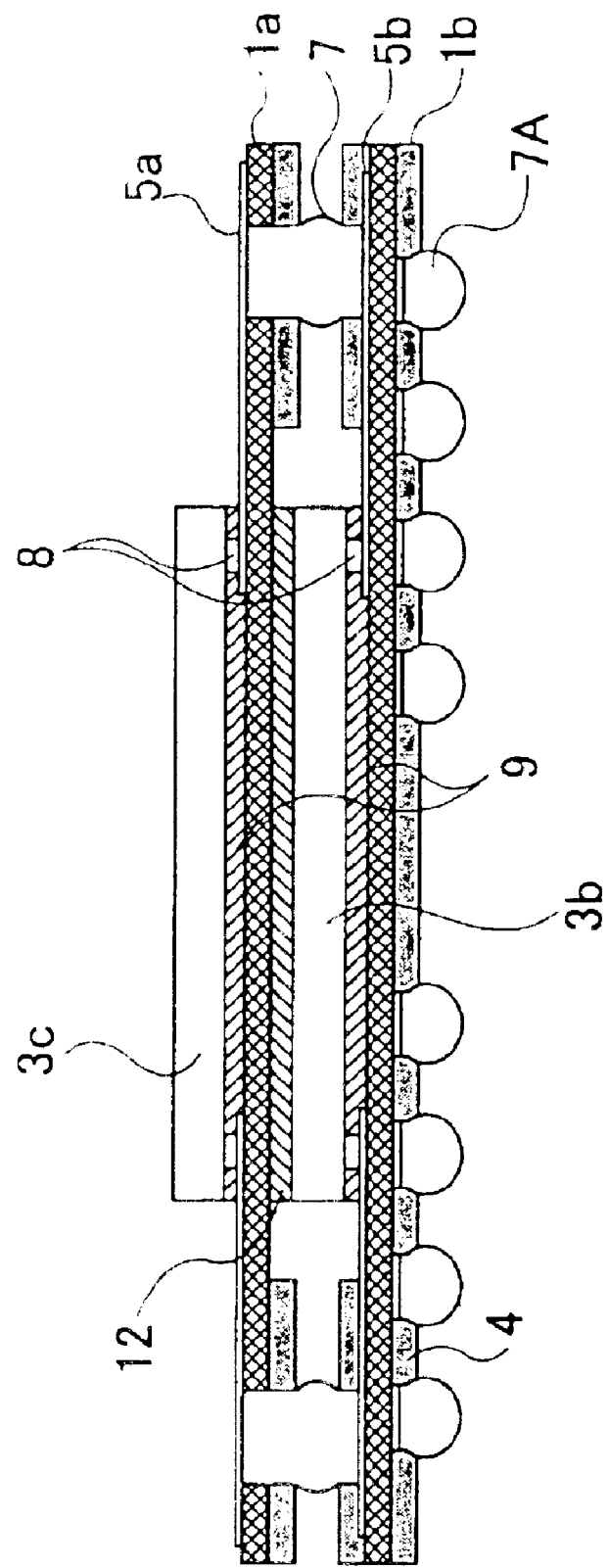
FIG. 14 is a cross-sectional view of a semiconductor device according to an eleventh embodiment of the present invention.

Next, a description will be given, with reference to FIG. 14, of a semiconductor device according to an eleventh embodiment of the present invention. FIG. 14 is a cross-sectional view of the semiconductor device according to the eleventh embodiment of the present invention. In FIG. 14, parts that are the same as the parts shown in FIG. 2 are given the same reference numerals, and descriptions thereof will be omitted.

The semiconductor device according to the eleventh embodiment of the present invention differs from the semiconductor device according to the first embodiment shown in FIG. 2 in that only the semiconductor chip 3b is provided between the interposers 1a and 1b and the semiconductor chip 3c is mounted on the top surface of the upper interposer 1a.

Here, semiconductor chip 3b is mounted by flip-chip connection onto the lower interposer 1b, and the semiconductor chip 3c is mounted by flip-chip connection onto the top surface of the upper interposer 1a. Therefore, the back surface of the semiconductor chip 3b faces the under surface of the upper interposer 1a, and the back surface of the semiconductor chip 3b is bonded to the under surface of the upper interposer 1a by the adhesive 12. The solder balls 7 extend through inside of the through holes formed in the upper interposer 1a, and are connected to ball pads 5a of the top surface of the upper interposer 1a and ball pads 5b formed on the top surface of the lower interposer 1b.

In the present embodiment, there is no need to maintain a height (distance) that is required for a resin seal part between the interposers 1a and 1b, and merely a distance, which is a sum of the height of the semiconductor chip 3b and the thickness of the adhesive 12, may be maintained. Thereby, the thickness of the semiconductor device according to the present embodiment can be reduced.

Additionally, in the present embodiment, since the back surface of the semiconductor chip 3b is fixed directly to the upper interposer 1c by the adhesive 12, similar to the above-mentioned semiconductor device according to the first embodiment shown in FIG. 2, it is prevented that a thermal stress and an external force are concentrated into the connection parts of the solder balls 7, thereby improving the reliability of the mechanical connection between the interposers.

Furthermore, in the process of joining the solder balls 7 to the interposers 1a and 1b by reflow, the adhesive 12 can be cured by heating at the time of reflow by making the adhesive 12 into a fast curable thermosetting resin Since the adhesive 12 is cured before the solder balls 7 are melted and solidified again, the interposers 1a and 1b are fixed to each other when the solder balls are solidified, and, thus, the positions of connection of the solder balls 7 do not shift. Therefore, accurate positioning of is attained and it is prevented that a residual stress occurs in the solder balls 7 at the time of reflow.

Moreover, in the present embodiment, since the interposer 1a is bonded to the semiconductor chip 3b by the thin layer of the adhesive 12, the heat generated within the semiconductor chip 3c is transmitted also to the lower interposer 1b through the interposer 1a, the adhesive bond 12 and the semiconductor chip 3b. The heat in the interposer 1b is efficiently released outside through the solder balls 7A. Therefore, since the number of paths to transmit the heat from the semiconductor chip mounted on the upper interposer 1a to the lower interposer 1b increases according to the present embodiment, the heat from the semiconductor chip can be efficiently released outside through the interposer 1b.

In addition, although the semiconductor chips 3b and 3c are mounted on the interposers 1a and 1b by flip-chip connection respectively, a TAB (tape automated bonding technique) may be used as a method of face-down mounting. Moreover, although the interposers 1a and 1b are electrically connected to each other by the solder balls 7, the connection is not limited to the disclosed method. For example, instead of the solder balls 7, the interposers 1a and 1b may be connected using materials such as a copper post electrode or a resin ball having a surface covered with a conductive material such as a Ni or Au film.

Figure 15:
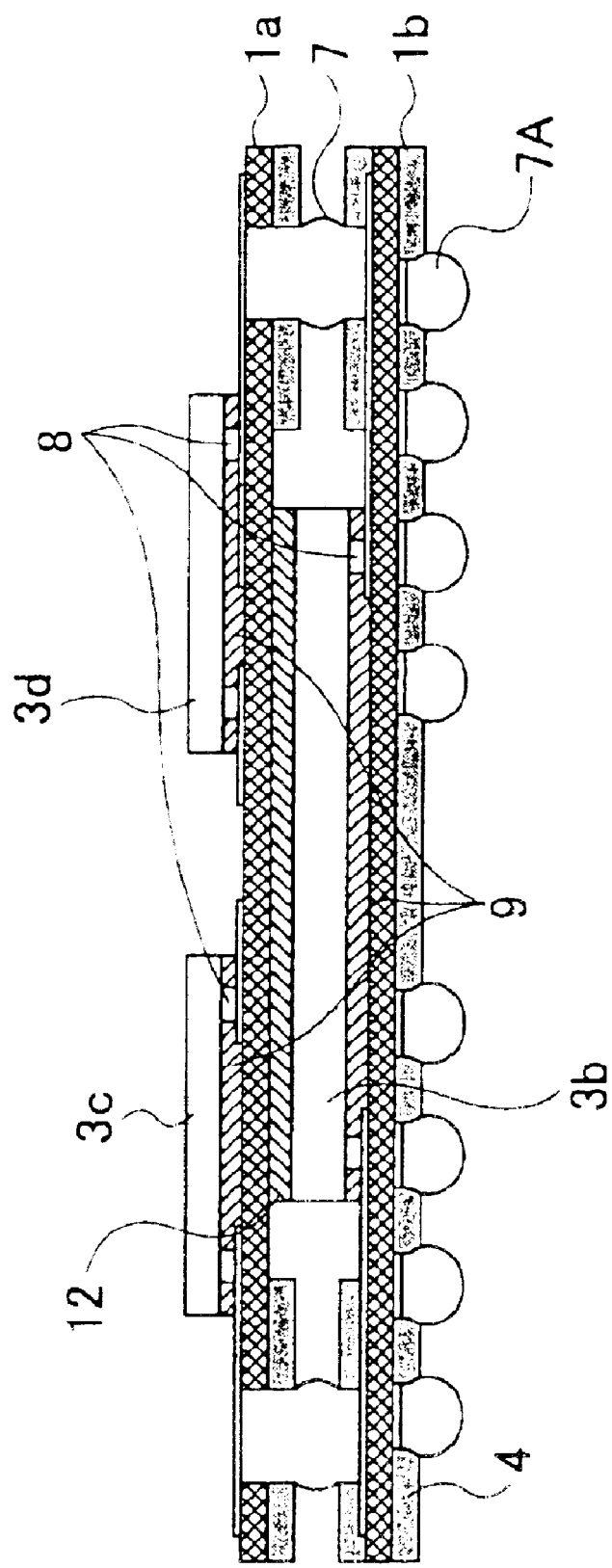
FIG. 15 is a cross-sectional view of a semiconductor device, which is a variation of the semiconductor device shown in FIG. 14.

It should be noted that, in the present embodiment, although one semiconductor chip 3c is mounted on the upper interposer 1a, a plurality of the semiconductor chips 3c may be mounted on the upper interposer 1a, as shown in FIG. 15.

Figure 16:
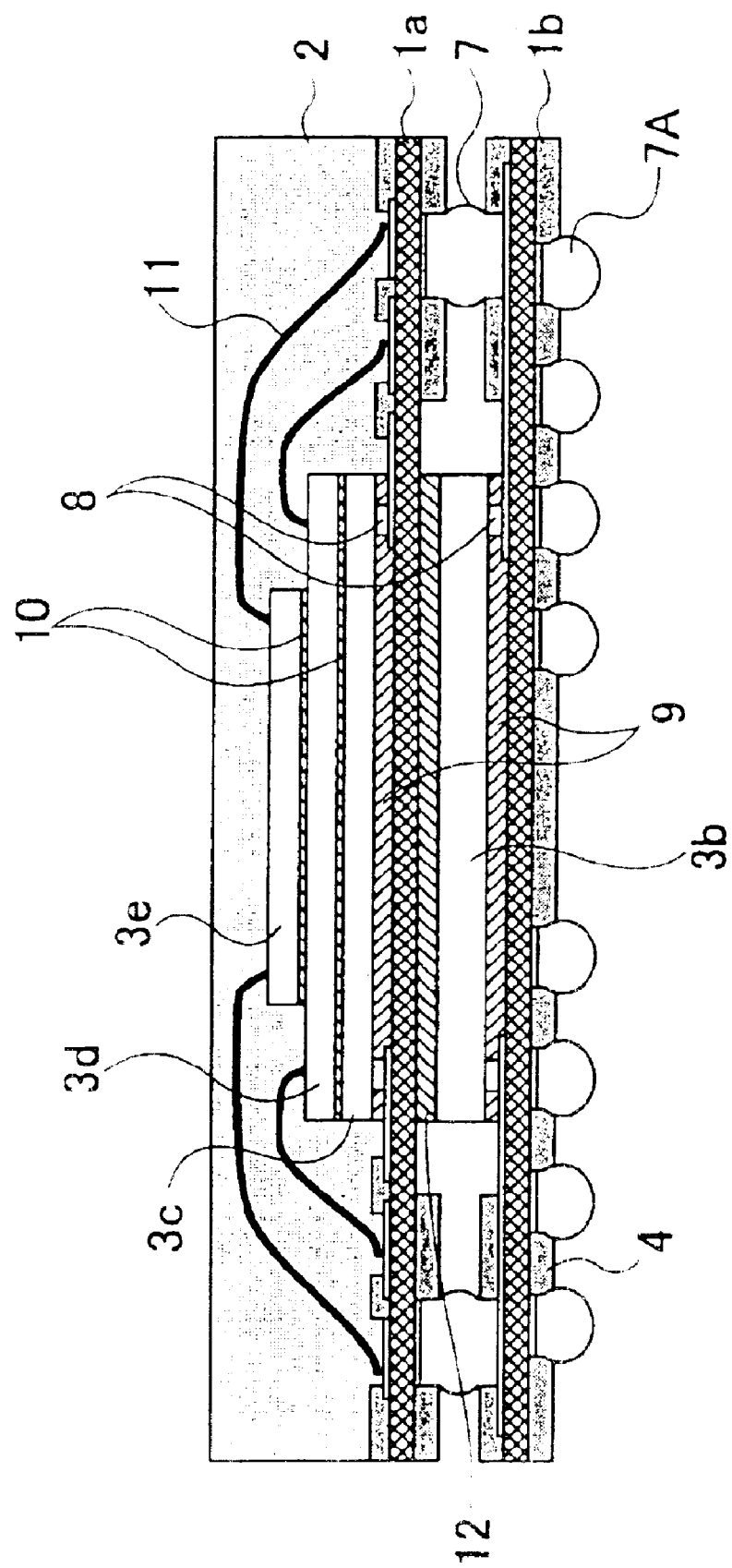
FIG. 16 is a cross-sectional view of a semiconductor device according to a twelfth embodiment of the present invention.

Next, a description will be given, with reference to FIG. 16, of a semiconductor device according to a twelfth embodiment of the present invention. FIG. 16 is a cross-sectional view of the semiconductor device according to the twelfth embodiment of the present invention. In FIG. 16, parts that are the same as the parts shown in FIG. 14 are given the same reference numerals, and descriptions thereof will be omitted.

The semiconductor device according to the twelfth embodiment of the present invention is formed by stacking a plurality of semiconductor chips 3c, 3d and 3e on the top surface of the interposer 1a of the semiconductor device shown in FIG. 14.

The semiconductor chip 3c is electrically connected to the top surface of the interposer 1a through the bumps 8. The semiconductor chip 3c and the interposer 1a are bonded by the under-fill adhesive 9.

The semiconductor chip 3d is mounted onto the back surface of the semiconductor chip 3c, and is bonded to the semiconductor chip 3c by the die bonding adhesive 10. As for the die bonding adhesive 10, a resin material such as epoxy, acrylics or polyimide is used. The semiconductor chips 3d is mounted on the semiconductor chip 3c with the circuit forming surface up, and is electrically connected to electrode pads formed on the top surface of the interposer 1a by Au wires 11.

The semiconductor chip 3e is smaller than the semiconductor chip 3d, and is arranged and stacked in the center section of the circuit forming surface of the semiconductor chip 3d in which no electrode pad is formed. The semiconductor chip 3e is stacked and mounted on the semiconductor chip 3d with the circuit forming surface up, and is electrically connected to the electrode pads formed on the top surface of the interposer 1a by the Au wires 11.

In the above-mentioned structure, the semiconductor chips 3c, 3d and 3e are encapsulated by the seal resin 2 on the top surface of the interposer 1a. As for the seal resin 2, materials such as epoxy, acrylics or polyimide is used.

The semiconductor device according to the present embodiment can provide the same effect as the semiconductor device according to the above-mentioned eleventh embodiment of the present invention. Moreover, the heat from the semiconductor chips 3c, 3d and 3e stacked on the top surface of the interposer 1a is transmitted to the lower interposer 1b through the semiconductor chip 3b bonded to the top surface of the interposer 1a. Thereby, the heat from the semiconductor chips 3c, 3d and 3e stacked and mounted on the top surface of the interposer 1a can also be efficiently released outside through the lower interposer 1b.

It should be noted that although three semiconductor chips are stacked and encapsulated on the top surface of the interposer 1a, the present invention is not limited to the number of semiconductor chips and the method of mounting semiconductor chips as explained and a different number of semiconductor chips may be stacked and mounted by a different mounting method.

Although the embodiments of the present invention were explained above, the present invention is not limited to the features disclosed in the above-mentioned embodiments, and it is interpreted that a combination of the above-mentioned embodiments is also within the scope of the present invention. For example, the connection parts of the solder balls 7 may be reinforced by applying the adhesive 16 or 16A shown in FIG. 11 or FIG. 12 to the connection parts of the solder balls 7 having the structure shown in FIG. 14. Additionally, the structure shown in FIG. 16 is used as a basic structure and features shown in FIG. 6 through FIG. 10 may be added.

The present invention is not limited to the specifically disclosed embodiments, and variations and modifications may be made without departing from the scope of the present invention.

The present application is based on Japanese priority application No. 2002-117534 filed Apr. 19, 2002, the entire contents of which are hereby incorporated by reference.

What is claimed is:

1. A semiconductor device comprising:
   a first semiconductor element having a circuit forming surface and a back surface opposite to the circuit forming surface;
   a first interposer having a surface on which first electrode pads are formed and said first semiconductor element is mounted with the circuit forming surface facing the first interposer;
   a second semiconductor element having a circuit forming surface and a back surface opposite to the circuit forming surface;
   a second interposer having a surface on which second electrode pads are formed and said second semiconductor element is mounted with the circuit forming surface facing the second interposer, the second electrode pads for connection with said first interposer;
   external connection terminals provided on a surface of said second interposer opposite to the surface on which said second semiconductor element is mounted;
   at least one third semiconductor element mounted on the surface of said first interposer on which said first semiconductor element is mounted,
   wherein said first interposer and said second interposer are electrically connected to each other by conductive members between said first and second electrode pads, and said first interposer and the back surface of said second semiconductor element are fixed to each other by an adhesive; and
   said first semiconductor element and said third semiconductor element are mounted in an area of said first interposer corresponding to a position where said second semiconductor element is attached.

2. A semiconductor device comprising:
   a first semiconductor element having a circuit forming surface and a back surface opposite to the circuit forming surface;
   a first interposer having a surface on which first electrode cads are formed and said first semiconductor element is mounted with the circuit forming surface facing the first interposer;
   a second semiconductor element having a circuit forming surface and a back surface opposite to the circuit forming surface;
   a second interposer having a surface on which second electrode pads are formed and said second semiconductor element is mounted with the circuit forming surface facing the second interposer, the second electrode pads for connection with said first interposer;
   external connection terminals provided on a surface of said second interposer opposite to the surface on which said second semiconductor element is mounted;
   at least one third semiconductor element is stacked on said first semiconductor element,
   wherein said first interposer and said second interposer are electrically connected to each other by conductive members between said first and second electrode pads, and said first interposer and the back surface of said second semiconductor element are fixed to each other by an adhesive;
   said first and third semiconductor elements are encapsulated on said first interposer; and
   said third semiconductor element is stacked on said first semiconductor element via an adhesive.

* * * * *

UNITED STATES PATENT AND TRADEMARK OFFICE
CERTIFICATE OF CORRECTION

PATENT NO. : 6,960,827 B2  Page 1 of 1
DATED : November 1, 2005
INVENTOR(S) : Takao Nishimura et al.

It is certified that error appears in the above-identified patent and that said Letters Patent is hereby corrected as shown below:

<u>Title page,</u>
Item [75], Inventors, delete "Hiroshi Onodera, Shibata (JP);".

Signed and Sealed this

Twenty-first Day of March, 2006

JON W. DUDAS
*Director of the United States Patent and Trademark Office*